United States Patent [19]

Nakamura

[11] Patent Number: 5,788,141
[45] Date of Patent: Aug. 4, 1998

[54] ADJUSTMENT MEANS FOR A DIE PUSH-UP ASSEMBLY

[75] Inventor: Osamu Nakamura, Kokubunji, Japan

[73] Assignee: Kabushiki Kaisha Shinkawa, Tokyo, Japan

[21] Appl. No.: 673,686

[22] Filed: Jun. 25, 1996

[30] Foreign Application Priority Data

Jun. 26, 1995 [JP] Japan ................... 7-182164

[51] Int. Cl.$^6$ ........................................ B23K 1/00
[52] U.S. Cl. ............................. 228/6.2; 228/49.5
[58] Field of Search ................. 228/6.2, 13, 49.5

[56] References Cited

U.S. PATENT DOCUMENTS

| | | | |
|---|---|---|---|
| 3,724,068 | 4/1973 | Galli | 228/6.2 |
| 3,949,925 | 4/1976 | Keizer et al. | 228/13 |
| 5,513,792 | 5/1996 | Onitsuka | 228/6.2 |
| 5,579,980 | 12/1996 | Ichikawa | 228/6.2 |
| 5,628,660 | 5/1997 | Onitsuka | 228/6.2 |

FOREIGN PATENT DOCUMENTS 3-40502  6/1991  Japan.
3-54858  8/1991  Japan.

*Primary Examiner*—P. Austin Bradley
*Assistant Examiner*—Jeffrey T. Knapp
*Attorney, Agent, or Firm*—Koda and Androlia

[57] ABSTRACT

A die push-up assembly used in a bonding machine, such as a die bonding or a tape bonding device, is provided on a die-push-up assembly adjustment device including an X-direction adjustment plate which has a pivot shaft, a Y-direction adjustment plate which is mounted on the X-direction adjustment plate so as to be movable in the Y-direction, an X-direction adjustment screw which allows the X-direction adjustment plate to pivot in the X direction about the pivot shaft, an eccentric shaft which allows the Y-direction adjustment plate to move in the Y direction, a first fastening screw which fastens the X-direction adjustment plate to the bonding apparatus, and a second fastening screw which fastens the Y-direction adjustment plate to the X-direction adjustment plate. The die push-up assembly is mounted on the Y direction adjustment plate so as to be adjusted in the horizontal direction.

3 Claims, 7 Drawing Sheets

ADJUSTMENT MEANS FOR A DIE PUSH-UP ASSEMBLY

BACKGROUND OF THE INVENTION

1. Field of the Invention

The present invention relates to an adjustment means for a die push-up assembly used in a bonding apparatus such as a die bonding apparatus, a tape bonding apparatus, etc.

2. Prior Art

As shown in FIG. 8, for instance, a die bonding apparatus, includes a wafer ring holder 111 which dismountably holds a wafer ring 110 for a semiconductor workpiece (described below), an XY direction moving device 112 to which the wafer ring holder 111 is attached so that the wafer ring holder 111 is moved in the X and Y (or horizontal) directions, a suction attachment nozzle 101 which is installed above the wafer ring holder 111, and a die push-up assembly 120 which is installed beneath the wafer ring holder 111.

In this die bonding apparatus, the semiconductor workpieces which are set on the wafer ring holder 111 are of those types in which wafer sheets 130 to which dies 140 are bonded are bonded to wafer rings 111. The die push-up assembly 120 includes a suction attachment body 125 which holds the wafer sheet 130 by suction and a push-up needle 124 which is installed inside the suction attachment body 125 so as to push up, as shown in FIG. 9(a), the dies 140 on the surfaces of the wafer sheets 112 while the wafer sheets 112 are held by the suction attachment body 125.

The dies 140 on the wafer sheet 130 are pushed upward by the push-up needle 124, and the dies 140 which have been pushed upward are held, as shown in FIG. 9(b) by the suction attachment nozzle 11 and moved.

The die bonding apparatus described above is disclosed in, for example, Japanese Patent Application Publication (Kokoku) Nos. 3-40502 and 3-54858.

Generally, in a bonding apparatus such as a die bonding apparatus and a tape bonding apparatus, an adjustment operation which will be described below must be performed prior to picking-up the dies from the first semiconductor workpiece from a lot for the semiconductor workpieces when the type of workpieces to be handled changes. In particular, with the wafer ring of the (first) semiconductor workpiece attached to the wafer ring holder, the push-up needle is adjusted so as to be positioned beneath the die that is to be pushed up so as to determine the initial position of the die pick-up. Since the main body frame of a conventional die push-up assembly is mounted on the base plate of the bonding apparatus by bolts, the adjustment operation is performed by first loosening the bolts and then moving the main body frame of the die push-up assembly.

Since the die push-up assembly is positioned beneath the wafer ring holder, the adjustment operation of the push-up assembly which is accomplished by loosening the bolts and removing the main body of the die push-up assembly is extremely difficult. The operation of positioning the push-up needle at the center of such small dies is a fine adjustment operation, requiring considerable time.

SUMMARY OF THE INVENTION

Accordingly, the object of the present invention is to provide an adjustment device for a die push-up assembly which is superior in terms of working characteristics and which allows the required adjustment operation to be performed quickly.

The object of the present invention is accomplished by a unique structure for an adjustment device in a die push-up apparatus of a bonding machine, and the unique structure of the adjustment device includes:

(a) an X-direction adjustment plate which extends in the Y direction from the front end side to the back end side of the bonding machine and has a supporting shaft on the back end side, (b) a Y-direction adjustment plate which is mounted on the X-direction adjustment plate so as to be movable in the Y-direction, (c) a die push-up assembly which is provided on the Y-direction adjustment plate, (d) an X-direction adjustment means which is installed on the front end side of the bonding apparatus and adjusts the position of the die push-up assembly in the X direction by allowing the X-direction adjustment plate to pivot in the X direction about the supporting shaft, (e) a Y-direction adjustment means which is installed on the front end side of the bonding apparatus and adjusts the position of the die push-up assembly in the Y direction by allowing the Y-direction adjustment plate to move in the Y direction, (f) an X-direction adjustment plate fastening means which is installed on the front end side of the bonding apparatus and fastens the X-direction adjustment plate to a predetermined portion of the apparatus, and (g) a Y-direction adjustment plate fastening means which is installed on the front end side of the bonding apparatus and fastens the Y-direction adjustment plate to the X-direction adjustment plate.

When the X-direction adjustment plate fastening means is loosened and the X-direction adjustment plate is moved to pivot about the supporting shaft by the X-direction adjustment means, the Y-direction adjustment plate and the die push-up assembly which are provided on the X-direction adjustment plate are pivoted accordingly; as a result, the position of the die push-up assembly in the X direction is thus adjusted. When the Y-direction adjustment plate fastening means is loosened and the Y-direction adjustment plate is moved via the Y-direction adjustment means in the Y direction, the position of the die push-up assembly in the Y direction is, as a result, adjusted. Thus, the X and Y directions or the horizontal directions of the die-push up device are adjusted easily and quickly.

BRIEF DESCRIPTION OF THE DRAWINGS

FIG. 5 illustrates one embodiment of the die push-up assembly, wherein

DETAILED DESCRIPTION OF THE PREFERRED EMBODIMENTS

One embodiment of the present invention will be described with reference to FIGS. 1 through 7.

Figure 1:
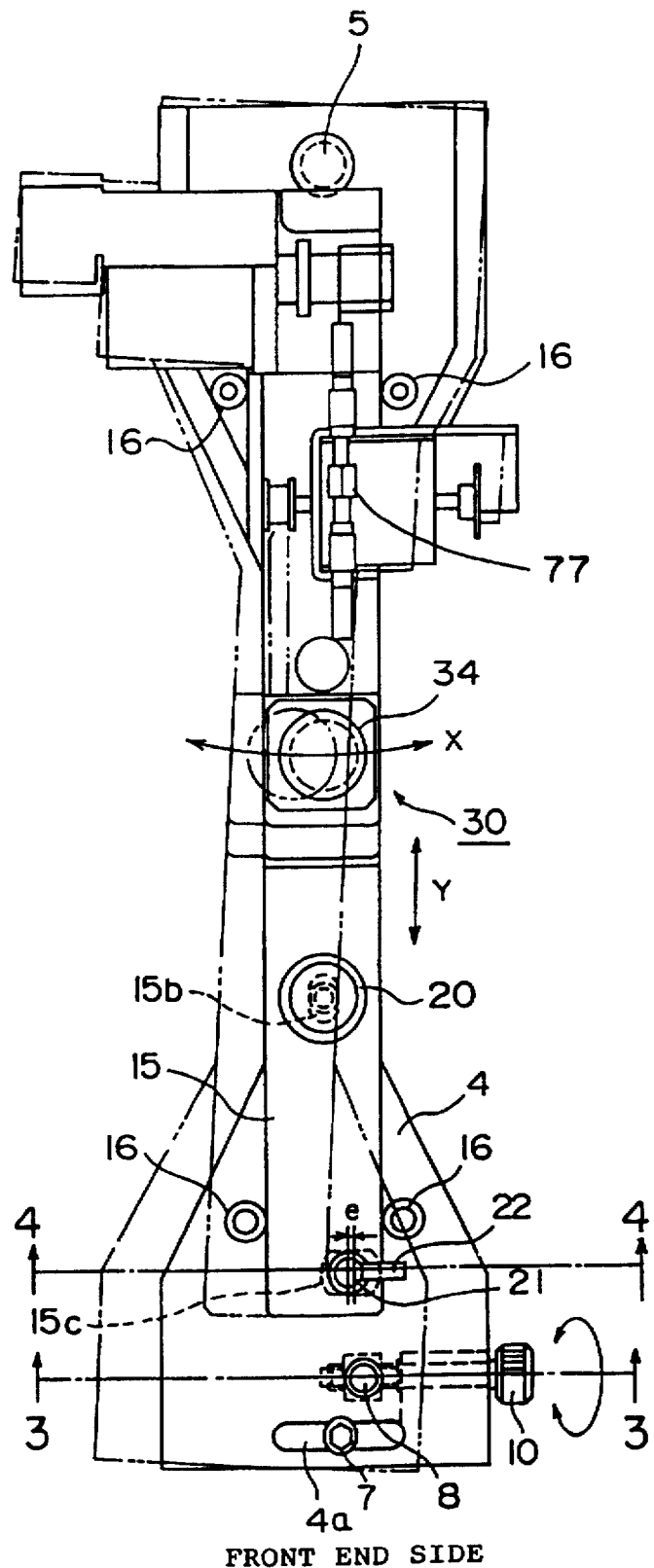
FIG. 1 is a top view of one embodiment of the adjustment device for a die push-up assembly provided by the present invention.
Figure 2:
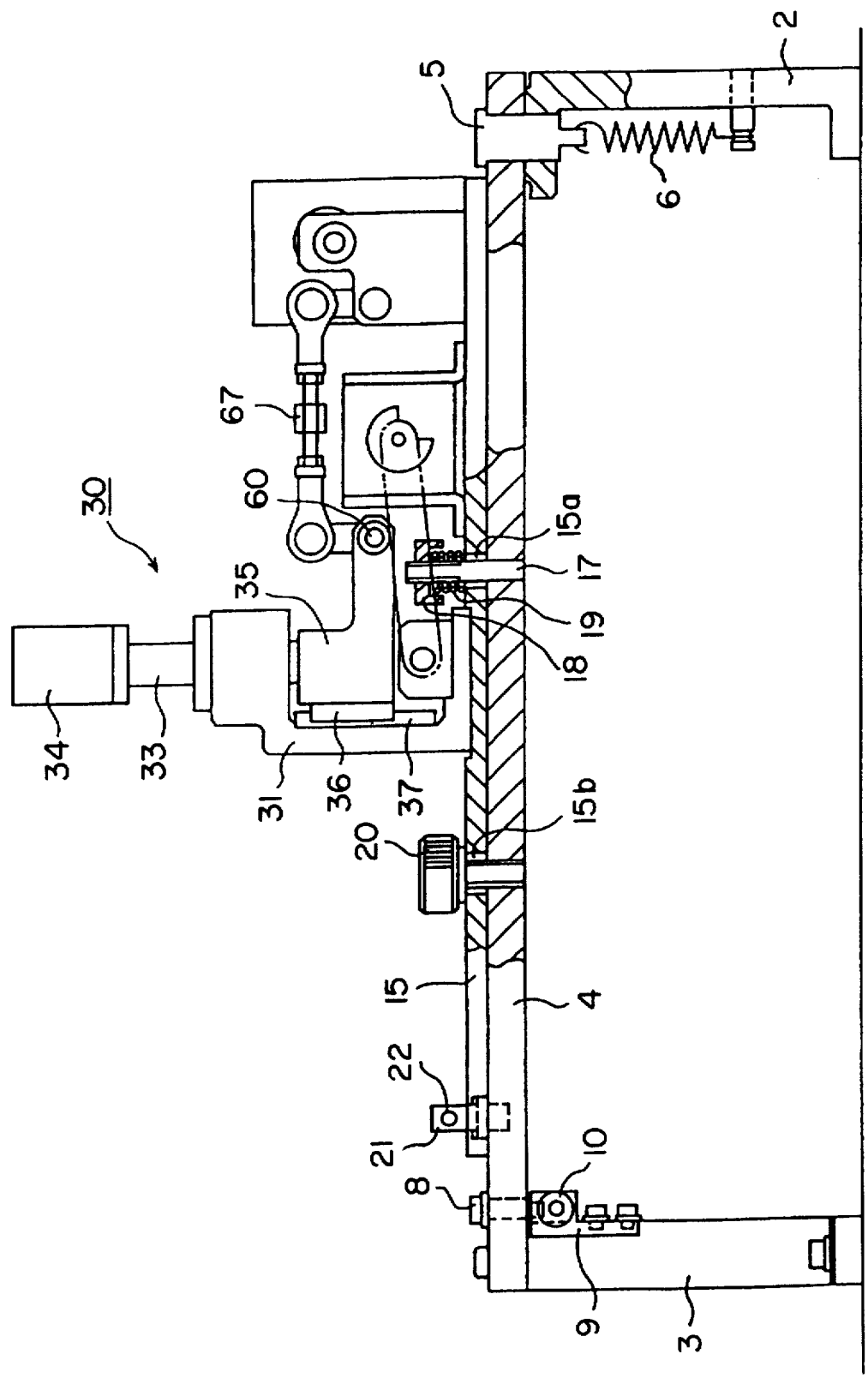
FIG. 2 is a right-side view thereof.

As best shown in FIG. 2, supporting plates 2 and 3 are fastened to the base plate 1 of a bonding apparatus such as a die bonding apparatus, a tape bonding apparatus, etc. The supporting plate 2, as seen from FIG. 1, is located on the back end side of the bonding apparatus and the supporting plate 3 is located on the front side of the bonding apparatus, respectively.

An X-direction adjustment plate 4 is mounted on the supporting plates 2 and 3. In particular, a supporting shaft 5 is inserted into the X-direction adjustment plate 4 and the supporting plate 2 so as to penetrate them. As a result, the X-direction adjustment plate 4 can make a pivot motion in the horizontal X direction as indicated in FIG. 1 about the shaft 5. A spring 6 is provided between the end portion of the supporting shaft 5 and the supporting plate 2 so that the supporting shaft 5 is urged by the spring 6 toward the base plate 1 (or downward). Thus, the X-direction adjustment plate 4 is pressed against the supporting plate 2.

As seen from FIG. 1, a slot 4a which extends in the X direction is formed at the front end portion of the X-direction adjustment plate 4 that is supported on the supporting plate 3. A fastening screw 7 is inserted into this slot 4a, so that the X-direction adjustment plate 4 is positionally fixed to the supporting plate 3 when the fastening screw 7 is tightened.

Figure 3:
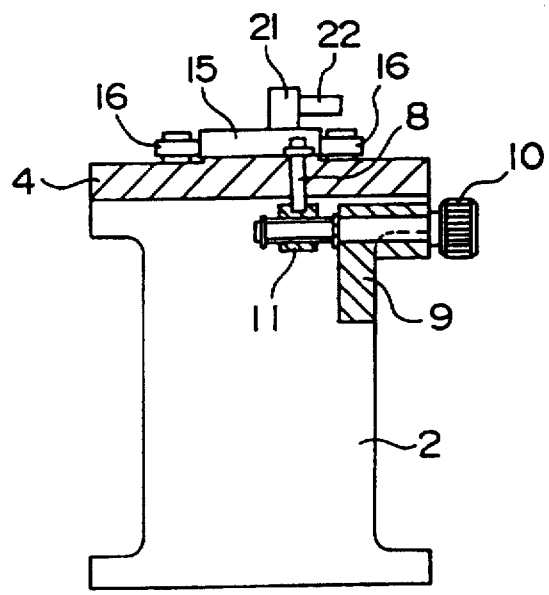
FIG. 3 is a sectional view taken along the line 3—3 in FIG. 1.

In addition, as shown in FIGS. 1 through 3, especially in FIG. 3, a pin 8 which protrudes downward is provided at the front end of the X-direction adjustment plate 4. A screw holder 9 is fastened to the supporting plate 3 so that the screw holder 9 faces the pin 8, and an X-direction adjustment means or screw 10 which extends in the X-direction is supported in the screw holder 9 in a rotatable fashion. A connecting piece 11 has an inner-threaded screw which is screw-engaged with the X-direction adjustment screw 10, and the lower tip end of the pin 8 is engaged with the connecting piece 11.

As shown in FIGS. 1 and 2, a Y-direction adjustment plate 15 is mounted on the X-direction adjustment plate 4. Both sides of this Y-direction adjustment plate 15 are, as best seen from FIG. 1, guided by Y-direction guide rollers 16 which are rotatably provided on the X-direction adjustment plate 4. Thus, the Y-direction adjustment plate 15 slides on the X-direction adjustment plate 4 in the Y direction.

Two slots 15a and 15b which extend in the Y direction are formed in the Y-direction adjustment plate 15. A screw shaft 17 which protrudes upward over the Y-direction adjustment plate 15 is fastened to the X-direction adjustment plate 4 so that the screw shaft 17 is located in the slot 15a. A spring retainer 18 is screwed to the screw shaft 17, and a coil spring 19 is installed between the sprint retainer 18 and the Y-direction adjustment plate 15 so that the Y-direction adjustment plate 15 is pressed against the X-direction adjustment plate 4 by the spring force of the coil spring 19. On the other hand, a fastening screw (or Y-direction adjustment plate fastening means) 20 is passed through the slot 15b, so that the Y-direction adjustment plate 15 is positionally fixed to the X-direction adjustment plate 4 by tightening the fastening screw 20.

Figure 4:
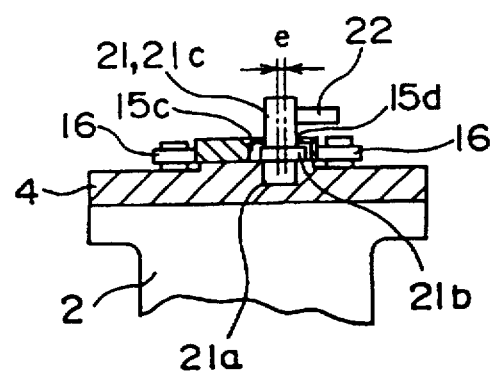
FIG. 4 is a sectional view taken along the line 4—4 in FIG. 1.

Furthermore, as shown in FIGS. 1, 2 and 4, especially in FIG. 4, the small-diameter portion 21a of an eccentric shaft 21 is rotatably inserted into a hole formed in the front end portion of the X-direction adjustment plate 4. The eccentric shaft 21 comprises a large-diameter portion 21b, which is formed on the small-diameter portion 21a, and an operating shaft portion 21c, which is formed on the large-diameter portion 21b. The large di meter portion 21b is offset from the small-diameter portion 21a by an eccentricity of e; and the operating shaft portion 21c, which has a smaller diameter than the large-diameter portion 21b, protrudes over the Y-direction adjustment plate 15. A Y-direction adjustment lever 22 is attached to the operating shaft portion 21c of the eccentric shaft 21.

As best shown in FIG. 4, a slot 15c which extends in the Y direction is formed in the undersurface of the Y-direction adjustment plate 15 so that the X direction sides of the slot 15c are in contact with the large-diameter portion 21b of the eccentric shaft 21. In addition, a shaft hole 15d which is smaller in diameter than the large-diameter portion 21b of the eccentric shaft 21 but larger in diameter than the operating shaft portion 21c of the shaft 21 is formed in the upper surface of the Y-direction adjustment plate 15.

A die push-up assembly 30 is mounted to the Y-direction adjustment plate 15. The structure of the die push-up assembly 30 is described below with reference to FIGS. 5 through 7.

Figure 5A:
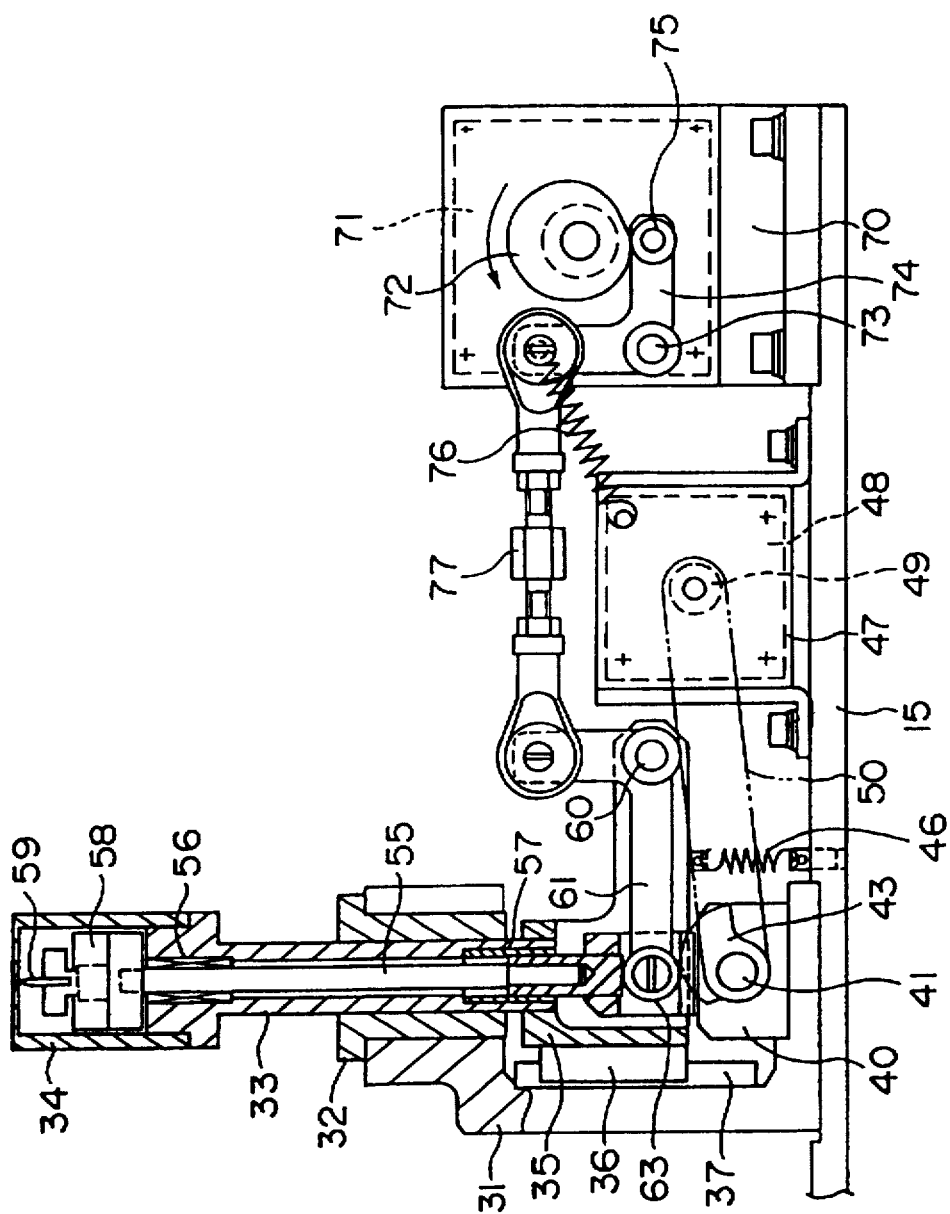
FIG. 5a is a vertical sectional side view.

As best seen in FIG. 5a, a C-shaped suction attachment body holding frame 31 is fastened to the Y-direction adjustment plate 15, and a hollow suction attachment body holder 33 is inserted into the suction attachment body holding frame 31 with a bearing 32 in between so that the suction attachment body holder 33 is moved up and down.

A suction attachment body 34 which has a suction attachment hole and a push-up needle insertion hole in its upper surface is fastened to the upper end portion of the suction attachment body holder 33. Vacuum suction is applied to the interior of the suction attachment body 34 by a vacuum means (not shown). A raising-and-lowering holder 35 is attached to the lower end portion of the suction attachment body holder 33, and a guide 36 is fastened to the raising-and-lowering holder 35 in an upright position. The guide 36 is slidabe in a vertical direction along the rail 37 which is fastened to the suction attachment body holding frame 31.

A cam shaft holder 40 is fastened to the suction attachment body holding frame 31 so as to be located beneath the suction attachment body holder 33, and a cam shaft 41 is rotatably provided on this cam shaft holder 40 via bearings 42. A suction attachment body raising-and-lowering cam (called "first cam") 43 and a timing pulley 44 are attached to the cam shaft 41. The raising-and-lowering holder 35 has a roller 45 so that the roller 45 is located above the first cam 43, and the raising-and-lowering holder 35 is urged downwardly by a spring 46 so that the roller 45 is pressed against the first cam 43.

A suction attachment body raising-and-lowering motor (called "first motor") 48 is mounted on the Y-direction adjustment plate 15 via a motor supporting plate 47. A timing belt 50 is provided between the timing pulley 44 and a timing pulley 49 which is coupled to the output shaft of the first motor 48.

A push-up needle raising-and-lowering shaft (called "needle rod") 55 is provided in the suction attachment body holder 33 with a ball bearing 56 and an oil-less bearing 57 interposed in between so that the needle rod 55 can be moved in a vertical direction. A push-up needle holder 58 is attached to the upper end of the needle rod 55, and a push-up needle 59 is fastened to the push-up needle holder 58. A contact rod 66 is attached to the lower end of the needle rod 55.

A supporting shaft 60 is fastened to the raising-and-lowering holder 35, and an L-shaped lever 61 which extends beneath the needle rod 55 is rotatably supported on the supporting shaft 60. A roller shaft 62 is fastened to one end of the L-shaped lever 61, and two rollers 63 and 64 are rotatably provided on the roller shaft 62.

A guide holder 65 is fastened to the lower end portion of the needle rod 55; and the lower end of the contact rod 66 is in contact with the upper surface of the roller 63. In addition, the guide holder 65 contacts the undersurface of the roller 64.

A push-up needle raising-and-lowering motor (called "second motor") 71 is fastened to the Y-direction adjustment plate 15 via a motor supporting plate 70, and a push-up needle raising-and-lowering cam (called "second cam") 72 is coupled to the output shaft of the second motor 71. A supporting shaft 73 is fastened to the motor supporting plate 70, and a lever 74 is rotatably provided on the supporting shaft 73. A roller 75 is rotatably attached to one end of the lever 74, and the lever 74 is urged by a spring 76 in the direction Z as shown in FIG. 5(a) so that the roller 75 is pressed against the second cam 72. The lever 61 and the lever 74 are linked by a linking member 77, which is adjustable in length, so that two levers 61 and 74 are moved together.

Next, the operation of the above embodiment will be described.

In case a new semiconductor workpiece is handled, a positional adjustment of the die push-up assembly 30 is executed. This adjustment is performed while the wafer ring of the semiconductor workpiece is being attached to the wafer ring holder (not shown).

As shown in FIGS. 1 through 4, adjustment in the X-direction of the die push-up assembly 30 is accomplished by loosening the fastening screw 7 and turning the X-direction adjustment screw 10.

In particular, when the X-direction adjustment screw 10 is turned after loosening the fastening screw 7, the X-direction adjustment plate 4 is pivoted about the supporting shaft 5 by the screw 10. Since the Y-direction adjustment plate 15 is on the X-direction adjustment plate 4, and the die push-up assembly 30 is on the Y-direction adjustment plate 15, the Y-direction adjustment plate 15 and the die push-up assembly 30 are both pivoted about the supporting shaft 5 together with the X-direction adjustment plate 4 when the X-direction adjustment plate 4 is pivoted. As a result, since the suction attachment body 34 and the push-up needle 59 of the die push-up assembly 30 are both moved in the X direction, the push-up needle 59 of the attachment body 34 can be adjusted to an appropriate X-direction position for the die that is to be pushed up.

On the other hand, an adjustment in the Y direction is accomplished by loosening the fastening screw 20 and turning the Y-direction adjustment lever 22.

In particular, when the Y-direction adjustment lever 22 is turned after loosening the fastening screw 20, the large-diameter portion 21b of the eccentric shaft 21 rotates in an eccentric manner and pushes the Y-direction side surface of the slot 15c formed in the Y-direction adjustment plate 15. As a result, the Y-direction adjustment plate 15 moves in the Y direction while being guided by the Y-direction guide rollers 16. Since the die push-up assembly 30 is provided on the Y-direction adjustment plate 4 15, the push-up needle 59 of the die push-up assembly 30 can be adjusted to an appropriate Y-direction position for the die that is to be pushed up.

When the X-direction and Y-direction adjustments have been completed, the fastening screws 7 and 20 are tightened back.

Figure 5B:
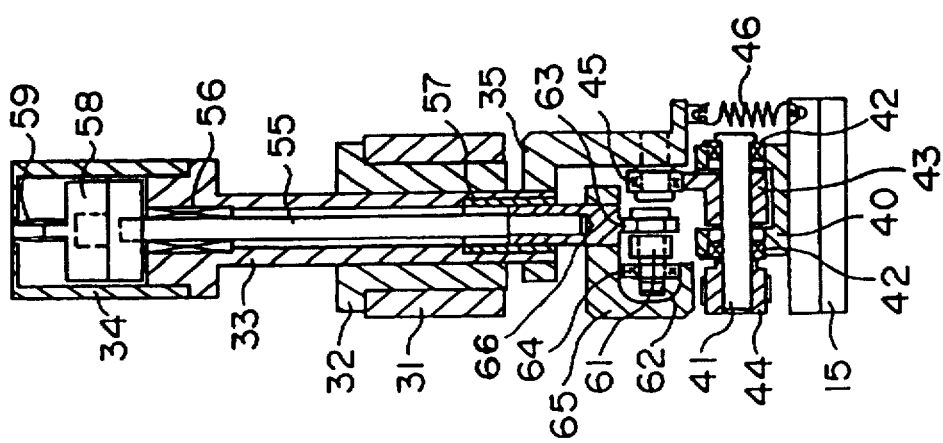
FIG. 5b is a vertical sectional front view.
Figure 6:
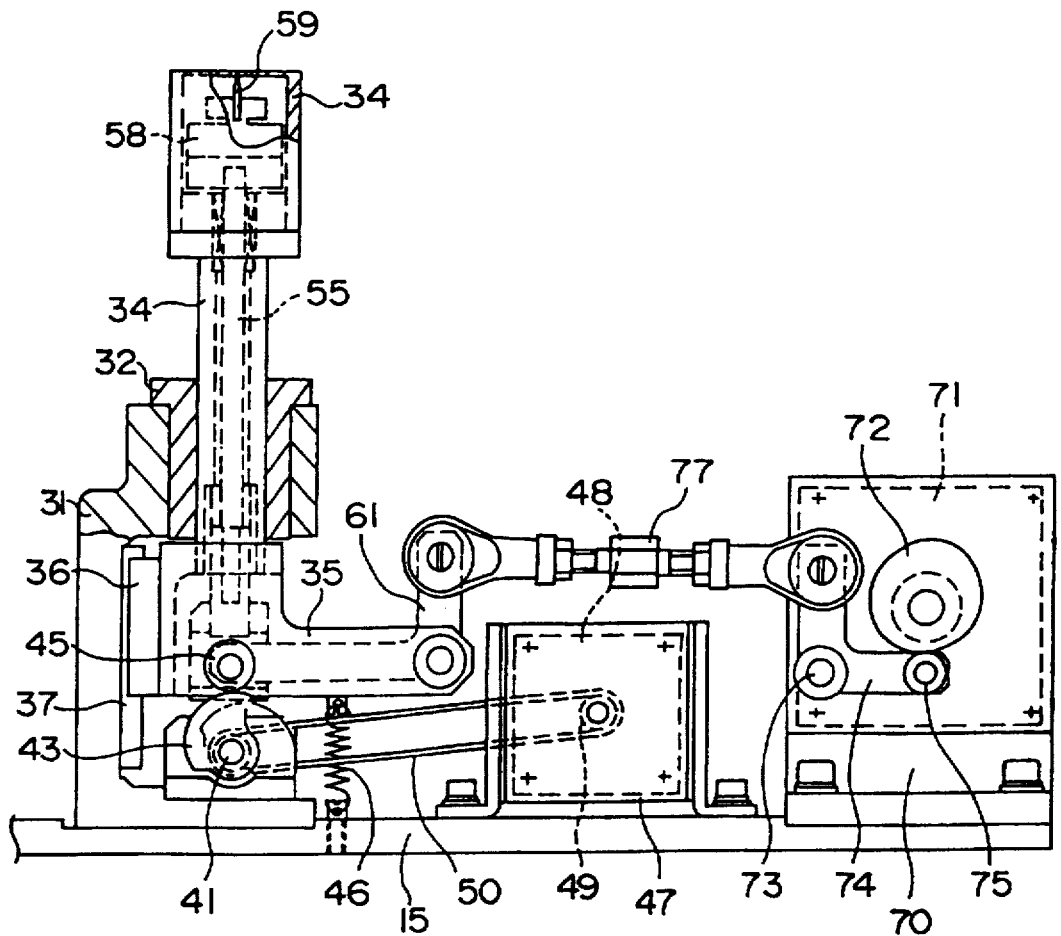
FIG. 6 is a partially sectional side view showing the suction attachment body in a raised position.
Figure 7:
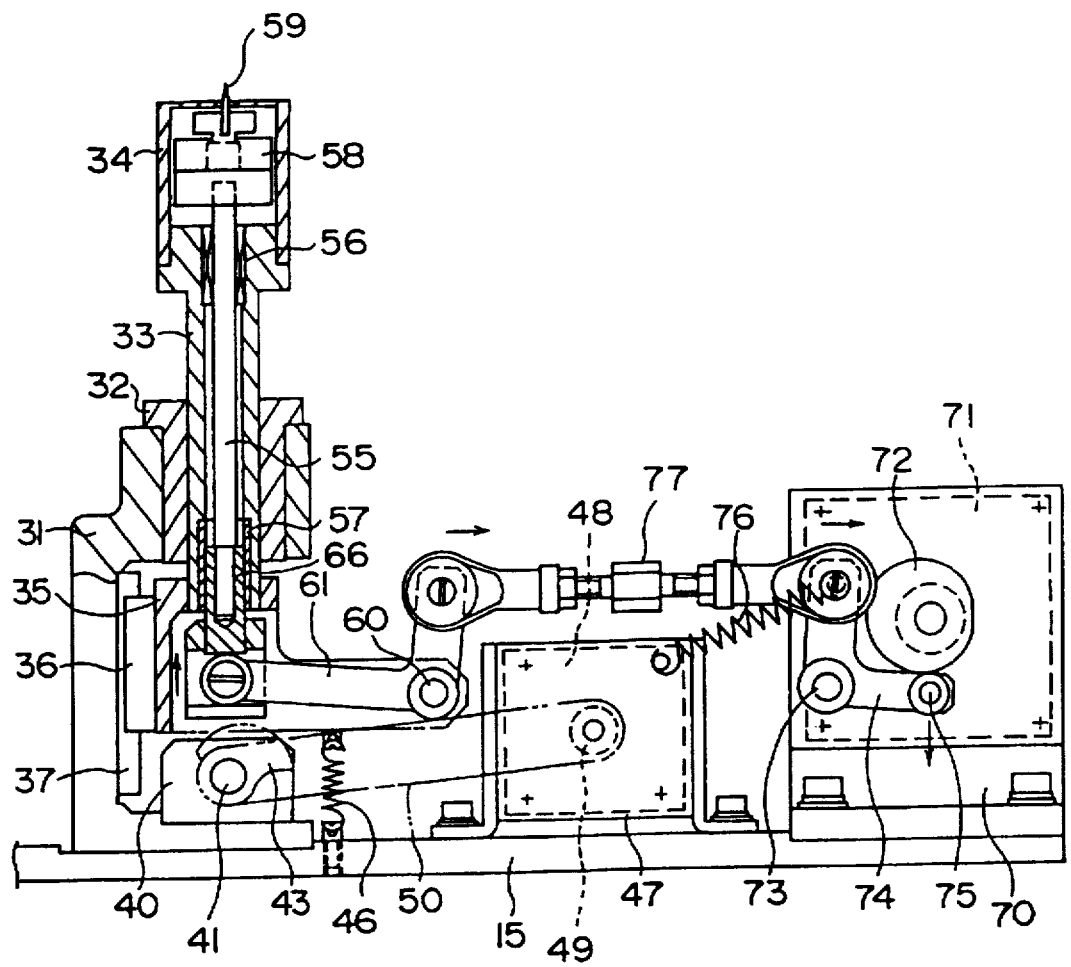
FIG. 7 is a vertical sectional side view which shows the push-up needle in a raised position.
Figure 8:
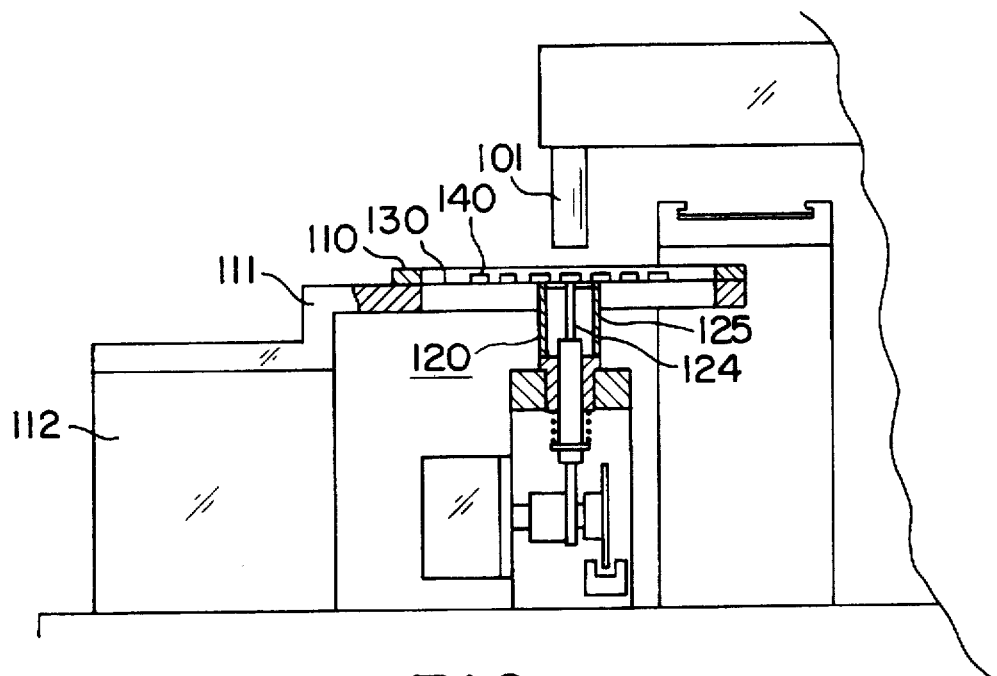
FIG. 8 shows a partial cross sectional view of a conventional die-bonding apparatus.
Figure 9A:
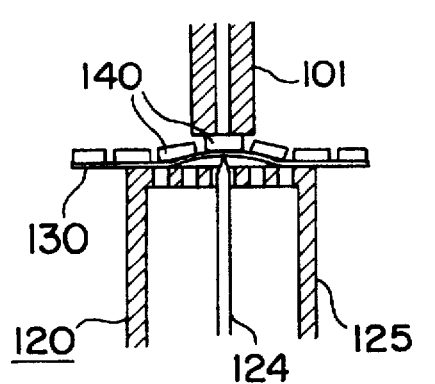
FIG. 9(a) shows of the die push up needle pushing up a die in the die-bonding apparatus shown in FIG. 8.
Figure 9B:
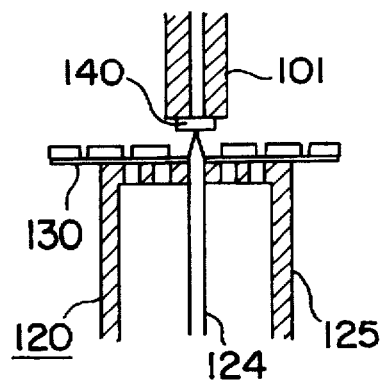
FIG. 9(b) shows a die held by a suction nozzle of the die-bonding apparatus shown in FIG. 8.

Next, the operation of the die push-up assembly 30 will be described with reference to FIGS. 5 through 7.

When the wafer ring of the semiconductor workpiece has been automatically or manually attached to the wafer ring holder, and the die (not shown) that is to be picked up has been positioned above the push-up needle 59, the first motor 48 is actuated. As a result, the cam shaft 41 is rotated by the timing pulley 49, timing belt 50 and timing pulley 44, and the first cam 43 is rotated from the state shown in FIG. 5(a) to the state shown in FIG. 6. Accordingly, the roller 45 is pushed up by the first cam 43. As described above, the roller 45 is attached to the raising-and-lowering holder 35, and the raising-and-lowering holder 35 is fastened to the suction attachment body holder 33, and further the suction attachment body 34 is fastened to the suction attachment body holder 33; accordingly, the suction attachment body 34 is moved upward and comes into contact with the undersurface of the wafer sheet (not shown), so that the wafer sheet is held in place by suction of the suction attachment body 34. At the same time, the suction attachment nozzle (not shown) is lowered until there is a slight gap between the suction attachment nozzle and the die.

When the suction attachment body 34 is moved upward as described above, since the supporting shaft 60 of the lever 61 which moves the push-up needle 59 up and down is attached to the raising-and-lowering holder 35, the supporting shaft 60 is also moved upward when the raising-and-lowering holder 35 is moved upward as described above. As a result, the push-up needle 59 is moved up together with the suction attachment body 34. In other words, even if the suction attachment body 34 is moved up and down, the push-up needle 59 does not move with the suction attachment body 34. Accordingly, even if the suction attachment body 34 is moved up and down, there is no upward movement of the push-up needle 59 from the upper surface of the suction attachment body 34 nor downward movement of the push-up needle 59 into the suction attachment body 34.

Next, the second motor 71 is actuated so that the second cam 72 is rotated. As a result, the roller 75 is pushed down, as shown in FIG. 7, the lever 74 pivots in the clockwise direction about the supporting shaft 73, and the linking member 77 is moved to the right in FIG. 7. Accordingly, the lever 61 pivots in the clockwise direction about the supporting shaft 60, and the rollers 63 and 64 are moved upward. When the rollers 63 and 64 are thus moved upward, the push-up needle raising-and-lowering shaft 55, the push-up needle holder 58 and the push-up needle 59 are also moved up. In other words, the die is, as a result, pushed up by the push-up needle 59, and the die which has thus been pushed upward is held by suction to the suction attachment nozzle.

When the second cam 72 is rotated even further, the roller 75 is moved up which is an action opposite to that described above. As a result, the die push-up assembly 30 actuates in the opposite direction from that described above, and the push-up needle 59 is lowered. Furthermore, the first motor 48 is actuated in the opposite direction from that described above, so that the suction attachment body 34 and push-up needle 59 are both moved down without any change in their relative positions as a result of the action which is the opposite of that described above.

After that, the wafer ring holder is driven so that the next die of the semiconductor piece is positioned in the pick-up position, and the actions described above are repeated.

As seen from above, the position of the die push-up assembly 30 in the X direction can be adjusted by loosening the fastening screw 7 and then turning the X-direction adjustment screw 10; and the position of the die push-up assembly 30 in the Y direction can be adjusted by loosening the fastening screw 20 and then turning the Y-direction adjustment lever 22.

The fastening screws 7 and 20, the X-direction adjustment screw 10 and the Y-direction adjustment lever 22 are all located on the front end side of the die bonding apparatus; accordingly, the positional adjustment in the X-Y directions of the die push-up assembly 30 can be performed easily. Thus, the adjustment device is superior in terms of working characteristics. Furthermore, since the adjustments are made by using the X-direction adjustment screw 10 and the Y-direction adjustment lever 22, it is possible to perform fine, precise adjustments in a short period of time.

As seen from the above, according to the present invention, the die push-up assembly adjustment device comprises:

(a) an X-direction adjustment plate which extends in the Y direction (or from the front end to the rear end) of a bonding apparatus and has a pivot shaft at the rear end, (b) a Y-direction adjustment plate which is mounted, in a movable fashion, on the X-direction adjustment plate, (c) a die push-up assembly mounted on the Y-direction adjustment plate, (d) an X-direction adjustment means which is installed on the front end area of the die bonding apparatus so as to adjust the position of the die push-up assembly in the X direction by allowing the X-direction adjustment plate to pivot in the X direction about the pivot shaft, (e) a Y-direction adjustment means which is installed on the front end area of the die bonding apparatus so as to adjust the position of the die push-up assembly in the Y direction by allowing the Y-direction adjustment plate to move in the Y direction, (f) an X-direction adjustment plate fastening means which is installed on the front end side of the die bonding apparatus so as to positionally fasten the X-direction adjustment plate to a predetermined point of the bonding apparatus, and (g) a Y-direction adjustment plate fastening means which is installed on the front end side of the die bonding apparatus so as to positionally fasten the Y-direction adjustment plate to the X-direction adjustment plate.

Accordingly, adjustment work can be performed quickly and with superior working characteristics.

I claim:

1. A device for adjusting a die push-up assembly used in a bonding apparatus characterized in that said device comprises:

an X-direction adjustment plate which extends in a Y direction from a front end side of a bonding apparatus to a rear end side of said bonding apparatus, said X-direction adjustment plate having a supporting shaft at a rear end side thereof;

a Y-direction adjustment plate which is provided on said X-direction adjustment plate so that said Y-direction adjustment plate can be moved in said Y direction;

a die push-up assembly which is fastened to said Y-direction adjustment plate;

an X-direction adjustment means which is installed on said front end side of said bonding apparatus so as to adjust a position of said die push-up assembly in said X direction by allowing said X-direction adjustment plate to pivot in said X direction about said supporting shaft, a Y-direction adjustment means which is provided on said front end side of said bonding apparatus so as to adjust a position of said die push-up assembly in said Y direction by allowing said Y-direction adjustment plate to be moved in said Y direction;

an X-direction adjustment plate fastening means which is provided on said front end side of said bonding apparatus so as to positionally fix said X-direction adjustment plate to said bonding apparatus, and a Y-direction adjustment plate fastening means which is provided on said front end side of said bonding apparatus so as to positionally fix said Y-direction adjustment plate to said X-direction adjustment plate.

2. A device for adjusting a die push-up assembly used in a bonding apparatus in horizontal directions that comprises an X-direction and a Y-direction, wherein said device is comprised of:

an X-direction adjustment plate which extends in said Y-direction and is connected at one end thereof to said bonding apparatus via a pivot shaft so that said X-direction adjustment plate is pivotable in said X-direction about said pivot shaft, said X-direction adjustment plate being provided at another end thereof with an opening extending in said Y-direction;

a Y-direction adjustment plate provided on said X-direction adjustment plate so that said Y-direction adjustment plate can be moved in said Y-direction on said X-direction adjustment plate;

an X-direction adjustment means provided on said bonding apparatus so as to engage with another end of said X-direction adjustment plate and to allow said X-direction adjustment plate to pivot about said pivot shaft, an X-direction adjustment plate fastening means provided in said opening of said X-direction adjustment plate so as to engage with said bonding apparatus and positionally secure said X-direction adjustment plate to said bonding apparatus;

a Y-direction adjustment means provided on said X-direction adjustment plate so as to engage with said Y-direction adjustment plate and allow said Y-direction adjustment plate to move in said Y direction on said X-direction adjustment plate; and a Y-direction adjustment plate fastening means provided on said Y-direction adjustment plate so as to engage with said X-direction adjustment plate and positionally secure said Y-direction adjustment plate to said X-direction adjustment plate, and wherein said die push-up assembly is provided on said Y-direction adjustment plate.

3. A device for adjusting a die push-up assembly in a horizontal direction, said device being mounted on a bonding apparatus and comprising:

an X-direction adjustment plate which is horizontally movable in one direction, a Y-direction adjustment plate which is mounted on said X-direction adjustment plate so as to be horizontally slidable in another direction which is perpendicular to said one direction, an X-direction adjustment means which allows said X-direction adjustment plate to move in said one direction, an eccentric member which allows said Y-direction adjustment plate to move in said another direction, a first fastening means for positionally fastening said X-direction adjustment plate relative to said bonding apparatus, and a second fastening means for positionally fastening said Y-direction adjustment plate relative to said X-direction adjustment plate, and said die push-up assembly being provided on said Y-direction adjustment plate.

* * * * *